United States Patent [19]

Farahat et al.

[11] Patent Number: 4,869,993

[45] Date of Patent: Sep. 26, 1989

[54] OPTICAL BRIGHTENER CONTAINING POSITIVE WORKING COLOR PROOFING SYSTEM

[76] Inventors: Wahib Farahat, 124 Dean St., Harrington Park, N.J. 07640; Dennis J. Bellville, R.D. #3, Box 221, Phillipsburg, N.J. 08865; Richard L. Shadrach, 25 Alpine Ct., Belle Mead, N.J. 08502

[21] Appl. No.: 237,863

[22] Filed: Aug. 29, 1988

[51] Int. Cl.$^4$ .................. G03C 7/20; G03C 11/12; G03C 5/18
[52] U.S. Cl. .................. 430/143; 430/142; 430/145; 430/192; 430/293; 430/257; 430/195; 430/262; 430/165; 430/166; 430/933
[58] Field of Search .............. 430/143, 142, 145, 192, 430/293, 257, 195, 262, 165, 166, 933

[56] References Cited

U.S. PATENT DOCUMENTS

| | | | |
|---|---|---|---|
| 3,854,950 | 12/1974 | Held | 430/300 |
| 4,304,839 | 12/1981 | Cohen et al. | 430/293 |
| 4,413,091 | 11/1983 | Iwasaki et al. | 430/175 |
| 4,659,642 | 4/1987 | Platzer et al. | |
| 4,734,356 | 3/1988 | Bauer et al. | 430/293 |

Primary Examiner—Paul R. Michl
Assistant Examiner—Thorl Chea

[57] ABSTRACT

This invention relates to positive working photosensitized sheet constructions which, upon exposure to an actinic radiation source through a screened image, can accurately reproduce said image. The construction is useful as a color proofing film which can be employed to predict the image quality from a lithographic printing process. The element is composed of a substrate, colored photosensitive layer and adhesive layer. The adhesive layer contains an optical brightener compound which reduces residual yellow staining derived from the naphthoquinone diazide sensitizer.

24 Claims, No Drawings

OPTICAL BRIGHTENER CONTAINING POSITIVE WORKING COLOR PROOFING SYSTEM

BACKGROUND OF THE INVENTION

This invention relates to positive working transfer type color proofing films. More particularly, it relates to positive working proofing films which ar photosensitized by naphthoquinone diazide compounds. Transfer type color proofing films are well known in the art as exemplified by U.S. Pat. No. 4,659,642. One problem with this type of system is that the proofing sheet acquires an undesired yellow stain in the non-image areas. This yellow stain is caused by the formation of a yellow colored azo dye. This azo dye is formed by the reaction between a photolyzed diazo which produces an indene carboxylic acid, and unreacted naphthoquinone diazide, under basic conditions. This color formation does not produce any ill effects when one is producing printing plates, since color in plates is not important. However, when one is producing multicolored proofing films, color is critical. In the graphic arts, it is desirable to produce a color proof to assist a printer in correcting a set of photomasks which will be used in exposing printing plates. The proof should reproduce the color quality that will be obtained during the printing process. The proof must be a consistent duplicate of the desired halftone or line image and should neither gain nor lose color. Visual examination of a color proof should reveal any defects on the photomask; the best color rendition to be expected from press printing of the material; the correct gradation of all colors and whether grays are neutral; the need, if any, for subduing any of the colors and/or giving directions for altering the film photomask before making the printing plates.

Color proofing sheets for multi-colored printing have heretofore been made by using a printing press proof which requires taking all the steps necessary for actual multicolor printing. Such a conventional method of color proofing has been costly and time consuming. Alternate color proofing methods have therefore been developed to simulate the quality of press proofs. There are two known types of photographic color proofing methods, namely, the surprint type and the overlay type.

In the overlay type of color proofing, an independent transparent plastic support is used for producing an image of each color separation film. A number of such supports carrying colored images are then superimposed upon each other and placed on a white sheet to produce a color proof. The overlay type of color proofing method has the disadvantage that the superimposed plastic supports tend to darken the color proofing sheet, and, as a result, the impression of the color proofing sheet thus prepared becomes vastly different from copies actually obtained by a conventional printing press proof. Its primary advantage is that it is quick and can serve as a progressive proof by combining any two or more colors in register. In the surprint type of color proofing method, a color proofing sheet is prepared by successively producing images of different colors from different color separation films onto a single receptor sheet. This is done by utilizing a single opaque support and by applying toners, photosensitive solutions or coatings of photosensitive materials of corresponding colors on the opaque support in succession. An example of this approach is described in U.S. Pat. No. 3,671,236. An advantage of the surprint type of color proof is that the color saturation is not influenced by superimposed plastic supports. This method more closely resembles the actual printing and eliminates the color distortion inherent in the overlay system.

Various processes for producing copies of an image embodying photopolymerization and thermal transfer techniques are known as shown in U.S. Pat. Nos. 3,060,023; 3,060,024; 3,060,025; 3,481,736; and 3,607,264. In these processes,a photo-polymerizable layer coated on a suitable support is imagewise exposed to a photographic transparency. The surface of the exposed layer is then pressed into contact with the image receptive surface of a separate element and at least one of the elements is heated to a temperature above the transfer temperature of the unexposed portions of the layer. The two elements are then separated, whereby the thermally transferrable, unexposed, image areas of the composite transfer to the image receptive element. If the element is not precolored, the tacky unexposed image may now be selectively colored with a desired toner. The colored matter preferentially adheres to the clear unpolymerized material. U.S. Pat. No. 3,574,049 provides a transfer process for printing a design on a final support which comprises (a) printing a design onto a temporary support, (b) superimposing the temporary support and the final support, (c) applying heat and/or pressure to the superimposed structure formed in (b), and (d) separating the temporary support from the final support which retains the printed design. The affinity of the design for the temporary support is lower than its affinity for the final support. In U.S. Pat. No. 3,721,557 a method of transferring colored images is claimed which provides a stripping layer coated between the photosensitive element and the support. When the photosensitive layer is exposed to actinic light and developed, the more soluble portions are selectively removed to produce a visible image. The image-carrying support is pressed against a suitable adhesive coated receptor and, subsequently, the carrier support sheet is stripped to accomplish the transfer of the image. A fresh layer of adhesive is applied to the receptor for each subsequent transfer. U.S. Pat. Nos. 4,260,673 and 4,093,464 describe positive working one-piece proofing systems based on orthoquinone diazides. In U.S. Pat. No. 4,093,464 a colored image is transferred to a receiver sheet after exposure and development. U.S. Pat. No. 4,260,673 describes transfer of a solid color layer to receiver sheet prior to exposure and development. U.S. Pat. No. 4,659,642 teaches a positive working color proofing system which has a transparent substrate, a colored photosensitive layer on the substrate, and a top adhesive layer. The present invention improves upon this construction by incorporating an optical brightener in the adhesive layer. It has been found that the salts and derivatives of optical brighteners such as triazinyl stilbene, benzoxazoles, coumarin and pyrazoline absorb incident light in the U.V. area at a maximum wavelength of 380 nm and re-emit part of the absorbed energy as visible light, usually in the blue region. Adding a small percentage of one of these derivatives to the adhesive solution results in the masking of the yellow stain left on the adhesive layer after exposing and developing with an aqueous alkaline developer. The result is that the non-image area appears much whiter to the eye and to measuring devices.

SUMMARY OF THE INVENTION

The present invention provides an improved photographic element and method for forming a colored image which comprises:

(A.) providing a photosensitive element which comprises, in order:
  (i) a substrate having a release surface; and
  (ii) a single, colored photosensitive layer on said release surface, which photosensitive layer comprises a light sensitive, positive working, naphthoquinone diazide compound; a resinous binder composition, which composition contains a major amount of at least one resin selected from the group consisting of a polyvinyl butyral polymer and a styrene-maleic anhydride copolymer half ester; and at least one colorant; and
  (iii) an adhesive layer directly adhered to said photosensitive layer, which adhesive layer comprises a major amount of a polymer such that said adhesive layer has softening point in the range of from about 60° C. to about 180° C. and sufficient amount of an optical brightener compound to reduce residual yellow color in the element derived from said diazide; and thereafter (B.) either
  (i) laminating said element with heat and pressure via said adhesive layer to a developer-resistant receiver sheet; and removing said substrate by the application of peeling forces; and imagewise exposing said photosensitive layer to actinic radiation; or
  (ii) imagewise exposing said photosensitive layer to actinic radiation; and laminating said element with heat and pressure via said adhesive layer to a developer-resistant receiver sheet; and removing said substrate by the application of peeling forces; or
  (iii) laminating said element with heat and pressure via said adhesive layer to a developer resistant receiver sheet; and imagewise exposing said photosensitive layer t actinic radiation; and removing said substrate by the application of peeling forces; and (C.) removing the non-exposed areas of said photosensitive layer with a suitable liquid developer, which removing is conducted at a temperature at which said adhesive layer is substantially non-tacky; and preferably (D.) repeating steps A through C at least once whereby another photosensitive element having at least one different colorant is laminated onto said receptor sheet over the non-removed portions of the previously laminated photosensitive layer or layers.

DETAILED DESCRIPTION OF THE PREFERRED EMBODIMENT

In the present invention, one provides a photographic element which broadly comprises a substrate having a release surface, a colored photosensitive layer on the release surface and an adhesive layer on the photosensitive layer. Optional additional layers containing antihalation materials, adhesion promoters or release agents may also be used.

In the preferred embodiment, the substrate is composed of a dimensionally and chemically stable base material which does not significantly change its size, shape, or chemical properties as the result of the heating, coating or other treatments which it must undergo. One preferred material is polyethylene terephthalate. In the usual case it has a thickness of from about 1 to about 10 mils, a more preferred thickness is from about 2-5 mils and most preferably from about 2-3 mils. Suitable films include Hostaphan 3000, available from Hoechst Celanese Corporation, Mylar D, available from DuPont and Melinex grades 0; 052; 442; 516 and S, available from ICI. The surface of the substrate may be smooth or may be provided with a matte texture by various methods known in the art.

Matte films include Melinex 377 and 470 from ICI. These materials have the unique property of giving the final image a desired matte finish without any extra steps. One can control the gloss of the final image by properly selecting the matte finish of the temporary support. This effect works because the top layer of the final image is originally in contact with this matte surface. This does not occur with a separate release layer between the temporary support and photosensitive layer. An additional advantage of coating on a matte surface is that subsequent transferred layers generally adhere better to a rough surface than to a smooth surface.

A similar matte finish of the final image can be obtained by embossing the shiny, top surface of the image with a matte material, such as described above. This is done by laminating together the final image and matte material under pressure and temperature. The matte material is then generally removed after lamination. The advantage of this method is that the finish of the final proof can be varied. Furthermore, the matting material can be used repeatedly.

A third method for producing a matte finish uses a heat transferable layer, such as Butvar 90, available from Monsanto, coated onto a film with a rough surface, such as Melinex 329, available from ICI. The adhesive layer is laminated to the final image under pressure and temperature. Then the film with the rough surface is peeled off. The rough surface imparts a matte finish to the final image. The advantage is that all layers appear matte and that the extra adhesive layer protects the image. U.S. Pat. Nos. 4,294,909 and 4,376,159, also suggests various methods for making a matte surface.

In either case, the substrate must have a release surface, that is, it must be capable of releasably holding the photosensitive layer thereto. This may be accomplished either by the substrate surface being inherently releasable, being rendered releasable by a suitable treatment or being provided with a release layer over the substrate surface. Such a release layer may comprise polyvinyl alcohol.

Releasably bonded to the release surface is the photosensitive layer. The photosensitive layer broadly comprises a photosensitizer, a colorant, a binding resin, and other optional ingredients such as plasticizers, acid stabilizers, surfactants, antistatic compositions, uv absorbers and residual coating solvents.

The photosensitizer is preferably a light sensitive, naphthoquinone diazide. The most preferred photosensitizer is the ester of bis-(3-benzoyl-4,5,6 trihydroxy -phenyl) -methane and 2-diazo-1-naphthol-5-sulfonic acid as taught in the U.S. Pat. No. 4,407,426. Other suitable photosensitizers are taught in the U.S. Pat. Nos. 4,266,001, 3,106,365, 3,148,983 and 3,201,239. The diazo compounds of choice are preferably soluble in organic solvents.

Suitable binding resins include polyvinyl butyral and styrene maleic anhydride copolymer half esters and mixtures thereof. Such resins include Butvar B72, B76 and B90 and Scripset 540 and 550, respectively, all available from Monsanto and SMA 2625 from ARCO. Another suitable binding resin is a vinyl acetate/vinyl alcohol/vinyl acetal terpolymer which is described in U.S. Pat. No. 4,665,124 which is incorporated herein by reference. In the most preferred embodiment the binder resin component is an admixture of a major amount of the styrene maleic anhydride copolymer half ester or polyvinyl butyral and a minor amount, more preferably about 20% to about 40% by weight of the aforesaid terpolymer. An important resin selection criterion is that it must be a good film former.

The colorants useful for the present invention include various classes of dyes and pigments. In the most preferred embodiment, pigments having an average particle size of about 1 micrometer or less are used.

Optional plasticizers which may be incorporated into the photosensitive layer include those of the phthalate and phosphate types. Preferred plasticizers include dibutyl phthalate and dimethyl phthalate.

These ingredients may be blended with such compatible solvents as propylene glycol monomethyl ether, methyl Cellosolve, gamma butyrolactone, and methyl ethyl ketone, coated on the release surface, and dried. In the preferred embodiment, the photosensitive layer has a coating between approximately 0.1 and 5.0 g/m². The most weight is from about 0.5 to 2.0 g/m².

In the preferred embodiment, the is present in the photosensitive layer in an of from about 15 to about 60 percent by weight; or more about 20 to about 50 percent by weight of the layer.

In the preferred embodiment, the is present in the photosensitive layer in an amount of about 10 to about 40 percent by weight; or more about 13 to about 34 percent by weight.

In the preferred embodiment, the resin is present in the photosensitive layer in an amount of about 20 to about 75 parts by weight; or more preferably about 30 to about 70 parts by weight.

In the preferred embodiment, the when one is used, is present in the photosensitive in an amount of up to about 20 parts by weight; or more up to about 15 parts by weight and most preferably from 12 to about 15 parts by weight.

Typical formulations for the photos layer include:

|  | Cyan | Yellow | Magenta | Black |
|---|---|---|---|---|
| Diacetone alcohol | — | 11.74 | — | — |
| Methyl ethyl ketone | 35.52 | 34.45 | 24.23 | 38.62 |
| gamma-butyrolactone | 22.60 | 11.15 | 24.04 | 5.74 |
| Dowanol PM | 34.76 | 35.21 | 44.94 | 48.34 |
| Scripset 540 | 1.60 | 2.01 | 2.15 | 2.39 |
| SMA 2625 | 1.74 | 1.17 | — | 0.60 |
| Butvar B-90 | 0.58 | 0.59 | 0.67 | 0.30 |
| Above diazo From U.S. Pat. No. 4,407,426 | 2.09 | 2.58 | 2.81 | 2.72 |
| Phthalo blue pigment | 1.11 | — | — | — |
| Yellow pigment | — | 1.08 | — | — |
| Magenta pigment | — | — | 1.15 | — |
| Black pigment | — | — | — | 1.29 |
| Optical density | 1.2 | 1.0 | 1.4 | 1.6 |

Scripset resins are from Monsanto. resins are from Arco. Dowanol PM is propylene glycol mon ether from Dow.

The adhesive layer comprises a ma of a polymeric material which is preferably and may optionally contain such other desired as uv absorbers, antistatic compositions and plasticizers Useful polyvinyl acetates non-exclusively include Mowilith DM-6, 20, DM-22, 25, 30 and mixtures thereof, available from AG. Other useful polymers non-exclusively may include polyvinyl acetals such as polyvinyl butyral, polyvinyl acrylic such as polymethyl methacrylate, copolymers containing .1 acetate, cellulose nitrate, phenolic resins, epoxy copolymers of these resins. These are usually dispersed in water, or dissolved in methyl isobutyl ketone or n-butyl or other solvent compositions for coating on the layer. It is then dried to a coating weight of from about 5 to about 30 g/m², more preferably from about 7 to about 20 g/m². The layer may optionally contain a uv absorber as Uvinul D-50 from G.A.F. It may also contain a plasticizer as Resoflex R-296, a polyester plasticizer available from Cambridge Industries. It may also contain antistats, such a and Gafstat from G.A.F. It may also contain other resins, Nitrocellulose RS ½, available from Hercules. The adhesive layer should not be tacky to the touch, during storage or development of the photosensitive element. The layer should have a softening point in the range of from about 60° C. to 180° C., preferably 60° C. to 120° C., more preferably 60° C. to In the preferred embodiment, polyvinyl acetate is in the adhesive layer in an amount of greater than about 50 by weight. The plasticizer may be present in an of up to about 30 percent by weight, the uv absorber up to 20 percent by weight, and other resins up to about 50 percent weight. In the practice of this invention it is required the adhesive layer contain a sufficient amount of an optical brightener to either reduce or eliminate residual yellow toning in the end product proofing film caused by the quinone diazide sensitizer. Preferred chemical classes of optical brightening compounds non-exclusively include benzoxazoles, coumarines, triazinyl stilbenes and pyrazolines.

Preferred optical brighteners non-exclusively include:

|  | CLASS | MANUFACTURER |
|---|---|---|
| *Tinopal SFP | Triazinyl stilbene | Ciba-Geigy |
| Tinopal DBS-X |  | Ciba-Geigy |
| Tinopal DSC |  | Ciba-Geigy |
| *Uvitex OB | Thiophene bisbenzoxazole | Ciba-Geigy |
| Phorwite K2002 | Pyrazoline | Mobay Chemical |
| Phorwite BKL | Stilbene | Mobay Chemical |
| Phorwite EBL | Coumarin | Mobay Chemical |
| Phorwite EV | Stilbene | Mobay Chemical |
| *Eastobrite OB-1 | Vinylene bisbenzoxazole | Eastman Chemical |
| *Aclarat 8678 | Coumarin | Sandoz Chemicals |
| Leucophor SF Granules | Coumarin | Sandoz Chemicals |

*Aclarat 8678: 7-Diethylamino-4-methyl coumarin
Eastobrite OB-1: 2,2,'-(1,2-Ethenediyl di-4,1-phenylene)bisbenzoxazole
Uvitex OB: 2,2'-(2,5-thiophenediyl)bis(5-tert-butyl benzoxazole)
Tinopal SFP: 2,2'-(1,2-Ethenediyl bis((3-sulfo-4,1 phenylene)imino-(6-(diethylamino)-1,3,5-triazine-4,2-diyl)imino)) bis-1,4-benzenedisulfonic acid, hexasodium salt In the preferred embodiment the optical brightener component is present in the adhesive layer in an amount of from about 0.01 to about 1.0% by weight of the dried layer. A more preferred range is from about 0.025% to about 0.75% and most preferably from about 0.05% to about 0.1.5%.

Typical adhesive formulations include:

|  | Weight Percent |
|---|---|
| I. i- butyl acetate | 78.97 |
| Mowilith 30 | 20.00 |

-continued

|  | Weight Percent |
| --- | --- |
| Resoflex | 1.00 |
| Uvitex OB | .03 |
| II. i-butyl acetate | 78.95 |
| Mowilith 30 | 20.00 |
| Resoflex R-296 | 1.00 |
| Phorwite K2002 | 0.15 |
| III. i-butyl acetate | 78.98 |
| Mowility 30 | 20.00 |
| Resoflex R-296 | 1.00 |
| Aclarat 8678 | .02 |
| IV. Gelva emulsion* | 49.99 |
| Water | 50.00 |
| Tinopal SFP | .01 |

*polyvinyl acetate available from Monsanto

In operation, the photosensitive element is laminated to a receptor sheet via the adhesive layer. The receiver sheet should be resistant to any adverse effects may be caused by the developer of choice. For example, the receiver sheet should be water resistant if aqueous are used. Plastic or plastic-coated receiver sheets ar for this purpose.

Useful receiver sheets include 329; 339; 994 and 3020 from ICI. Other white and non-white receiver sheets may also be used. Rough textured and/or promoted surfaces are preferred for the receiver, which be able to withstand the laminating and development processes Lamination may be conducted by putt the receiver sheet in contact with the adhesive side of colored composite and then introducing the two materials into nip of a pair of heated laminating rollers under suitable Suitable laminating temperatures usually range from about 60° C. to about 90° C., preferably about 75° C. to about 85° C. After lamination, the substrate is peeled away, usually merely employing manual peeling forces. The adhesive and photosensitive layers thus remain o the receiver sheet.

The photosensitive layer is imagewise exposed by means well known in the art either before or after lamination. Such exposure may be conducted by exposure to a uv light source through a photomask under vacuum frame conditions. Exposure may be performed with actinic light through a conventional positive flat. Exposures after lamination and peel apart are preferred for emulsion-to-emulsion contact. Mercury vapor discharge lamps are preferred over metal halide lamps. Filters may be used to reduce light scattering in the material.

After lamination, peel apart and exposure, the photosensitive layer is developed by dissolving the non-exposed area in a suitable developer and dried. The adhesive layer is not removed by this development. Suitable developers non-exclusively include:

| I. | |
| --- | --- |
| Water | 95.0 |
| Sodium decyl sulphate | 3.0 |
| Disodium phosphate | 1.5 |
| Sodium metasilicate | 0.5 |
| II. | |
| Water | 89.264 |
| Monosodium phosphate | 0.269 |
| Trisodium phosphate | 2.230 |
| Sodium tetradecyl sulfate | 8.237 |

Any developer solution which satisfactorily removes the non-exposed areas of the photosensitive layer after exposure while retaining the image areas may be used. The selection of developer is well within the ability of the skilled artisan.

The process can then be repeated whereby another photosensitive element having a different color is laminated to the sam receiver sheet over the previously formed image. In the usual case, four colored layers are employed to produce a full color reproduction of a desired image. These are cyan, magenta, yellow and black.

The following non-limiting example serves to illustrate the invention.

EXAMPLE

Four photosensitive solutions of cyan, yellow, magenta, and black are produced according to photosensitive formulations described above. The pigment is introduced as a dispersion of methyl ethyl ketone, Scripset 540, and the appropriate pigment. The solutions are coated and dried separately to the required optical density onto 3 mil Melinex 516 polyester films as temporary support. The surface densities are roughly 1.2 g/m$^2$ for cyan, 1.4 g/m$^2$ for yellow, 2.0 g/m$^2$ for magenta, and 1.0 g/m$^2$ for black. The adhesive solution, in particular adhesive formulation number I above, is coated on top of the photosensitive layers and dried to an surface density of 12 g/m$^2$. The yellow composite is then laminated at 80° C. with the adhesive side onto either side of a 7 mil Melinex 3020 polyester receiver sheet. The 516 temporary support is peeled away after lamination, leaving the adhesive and photosensitive layers on the receiver sheet. The yellow photosensitive layer is then exposed to actinic light through a photographic flat for the yellow color. The receiver sheet with the exposed yellow layer is then immersed for 15 sec in developer II above at 27° C. with gentle pad rubbing on the photosensitive side. The exposed yellow areas are thereby washed off and the non-exposed areas remain during development. The adhesive layer is not effected by the developer. After this treatment, the imaged material is rinsed and then dried. The magenta composite is then laminated as before onto the imaged, yellow side of the receptor sheet. The temporary support is removed as before. The magenta layer is then exposed through the magenta flat. It is then processed as with the yellow. The magenta is followed in a like manner by cyan and then by black to give a four-color image which is an accurate representation of the original from which separations are prepared.

What is claimed is:

1. A method for forming a colored image which comprises:

(A.) providing a photosensitive element which comprises, in order:

(i) a substrate having a release surface; and (ii) a colored photosensitive layer on said release surface, which photosensitive layer comprises a light sensitive, positive working, naphthoquinone diazide compound in an amount sufficient to photosensitize the layer; a resinous binder composition in an amount sufficient to bind the layer ingredients into a uniform admixture, which composition contains a major amount of at least one resin selected from the group consisting of a polyvinyl butyral polymer and a styrene-maleic anhydride copolymer half ester; and at least one colorant in an amount sufficient to uniformly color the layer; and (iii) an adhesive layer on said photosensitive layer, which adhesive layer comprises a major amount of a polymer such that said adhesive layer has a softening point in the range of from about 60° C. to about 180° C., and a sufficient amount of an optical brightener compound effective to reduce residual yellow color in the element derived from said diazide, and thereafter (B.) either (i) laminating said element with heat and pressure via said adhesive layer to a developer resistant receiver sheet and removing said substrate by the application of peeling forces; and imagewise exposing said photosensitive layer to actinic radiation; or (ii) imagewise exposing said photosensitive layer to actinic radiation; and laminating said element with heat and pressure via said adhesive layer to a developer resistant receiver sheet; and removing said substrate by the application of peeling forces; or (iii) laminating said element with heat and pressure via said adhesive layer to a developer resistant receiver sheet; and imagewise exposing said photosensitive layer to actinic radiation; and removing said substrate by the application of peeling forces; and (C.) removing the exposed areas of said photosensitive layer with a suitable liquid developer, which removing is conducted at a temperature at which said adhesive layer is substantially non-tacky.

2. The method of claim 1 wherein steps A through C are repeated at least once whereby another photosensitive element having at least one different colorant is laminated onto said receptor sheet over the nonremoved portions of the previously laminated photosensitive layer or layers.

3. The method of claim 1 wherein said substrate comprises polyethylene terepthalate.

4. The method of claim 1 wherein said substrate has a matte surface.

5. The method of claim 1 wherein said release surface on said substrate comprises polyvinyl alcohol.

6. The method of claim 1 wherein said photosensitive layer comprises the ester of bis-(3-benzoyl-4,5,6 trihydroxyphenyl) methane and 2-diazo-1-naphthol-5-sulfonic acid.

7. The method of claim 1 wherein said photosensitive layer further comprises one or more ingredients selected from the group consisting of plasticizers, acid stabilizers, antistatic compositions, uv absorbers and surfactants.

8. The method of claim 1 wherein the adhesive layer further comprises one or more ingredients selected from the group consisting of uv absorbers, anti-static compositions, resins, nitrocellulose and plasticizers.

9. The method of claim 1 wherein the adhesive layer comprises polyvinyl acetate.

10. The method of claim 1 wherein the laminating step is conducted at a temperature of from about 60° C. to about 90° C.

11. The method of claim 1 wherein said adhesive layer comprises one or more polymers selected from the group consisting of polyvinyl acetate containing copolymers, polyvinyl acetals, acrylic resins, cellulose nitrate, phenolic resins, epoxy resins and copolymers thereof.

12. The method of claim 1 wherein said optical brightener compound is selected from the group consisting of a triazinyl stilbene, pyrazoline, benzoxazole and coumarin derivative.

13. The method of claim 1 wherein said optical brightener compound is present in an amount of from about 0.01 to about 1.0 percent by weight of the adhesive layer.

14. A photosensitive element which comprises, in order:

(i) a substrate having a release surface; and (ii) a colored photosensitive layer on said release surface, which photosensitive layer comprises a light sensitive, positive working, naphthoquinone diazide compound in an amount sufficient to photosensitize the layer; a resinous binder composition in an amount sufficient to bind the layer ingredients into a uniform admixture, which composition contains a major amount of at least one resin selected from the group consisting of a polyvinyl butyral polymer and a styrene-maleic anhydride copolymer half ester; and at least one colorant in an amount sufficient to uniformly color the layer; and (iii) an adhesive layer on said photosensitive layer, which adhesive layer comprises a major amount of a polymer such that said adhesive layer has a softening point in the range of from about 60° C. to about 180° C., and a sufficient amount of an optical brightener compound effective to reduce residual yellow color in the element derived from said diazide.

15. The element of claim 14 wherein said substrate comprises polyethylene terepthalate.

16. The element of claim 14 wherein said substrate has a matte surface.

17. The element of claim 14 wherein said release surface on said substrate comprises polyvinyl alcohol.

18. The element of claim 14 wherein said photosensitive layer comprises the ester of bis-(3-benzoyl-4,5,6 trihydroxy phenyl)methane and 2-diazo-1-naphthol-5-sulfonic acid.

19. The element of claim 14 wherein said photosensitive layer further comprises one or more ingredients selected from the group consisting of plasticizers, acid stabilizers, antistatic compositions, uv absorbers and surfactants.

20. The element of claim 14 wherein the adhesive layer further comprises one or more ingredients selected from the group consisting of uv absorbers, anti-static compositions, resins, nitrocellulose and plasticizers.

21. The element of claim 14 wherein said adhesive layer comprises one or more polymers selected from the group consisting of polyvinyl acetate containing copolymers, polyvinyl acetals, acrylic resins, cellulose nitrate, phenolic resins, epoxy resins and copolymers thereof.

22. The element of claim 14 wherein said optical brightener compound is selected from the group consisting of triazinyl stilbene, pyrazoline, benzoxazole and coumarin derivatives.

23. The element of claim 14 wherein said optical brightener compound is present in an amount of from about 0.01 to about 1.0 percent by weight of the adhesive layer.

24. The element of claim 14 wherein the adhesive layer comprises polyvinyl acetate.

* * * * *

UNITED STATES PATENT AND TRADEMARK OFFICE
CERTIFICATE OF CORRECTION

PATENT NO. : 4,869,993

DATED : September 26, 1989

INVENTOR(S) : Wahib Farahat, Dennis J. Bellville, Richard L. Shadrach

It is certified that error appears in the above-identified patent and that said Letters Patent is hereby corrected as shown below:

On column 3, line 43, delete "non-".

On column 7, line 8, change "0.15" to -- 0.05 --;
on line 51, delete "non-"; and on line 67, delete "non-".

Signed and Sealed this

Twelfth Day of March, 1991

Attest:

HARRY F. MANBECK, JR.

*Attesting Officer*      *Commissioner of Patents and Trademarks*